(12) United States Patent
Okoroanyanwu et al.

(10) Patent No.: US 6,764,808 B2
(45) Date of Patent: Jul. 20, 2004

(54) SELF-ALIGNED PATTERN FORMATION USING WAVELENGHTS

(75) Inventors: Uzodinma Okoroanyanwu, Mountain View, CA (US); Armando C. Bottelli, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/083,914

(22) Filed: Feb. 27, 2002

(65) Prior Publication Data

US 2003/0162135 A1 Aug. 28, 2003

(51) Int. Cl.[7] .................................................. G03F 7/20
(52) U.S. Cl. ..................................... 430/311; 430/394
(58) Field of Search .............................. 430/311, 312, 430/322, 394, 396

(56) References Cited

U.S. PATENT DOCUMENTS

| | | | |
|---|---|---|---|
| 4,704,347 A | 11/1987 | Vollenbroek et al. | 430/312 |
| 4,810,601 A | * 3/1989 | Allen et al. | 430/18 |
| 5,876,904 A | * 3/1999 | Uetani | 430/326 |

FOREIGN PATENT DOCUMENTS

| | | |
|---|---|---|
| EP | 0 098 922 | 1/1987 |
| EP | 0 366 503 | 5/1990 |

OTHER PUBLICATIONS

International Search Report for International Application No. PCT/ US03/14960, Filing Date Feb. 12, 2003 (3 pages).

* cited by examiner

Primary Examiner—Kathleen Duda
(74) Attorney, Agent, or Firm—Foley & Lardner, LLP

(57) ABSTRACT

An integrated circuit fabrication process for patterning features at sub-lithographic dimensions is disclosed herein. The process includes sequentially exposing a of a film of arylalkoxysilane with a photobase generator, and catalytic amount of water coated on top of a conventional lipophilic photoresist layer provided over a substrate and exposed to a radiation at a first and a second lithographic wavelengths. The first lithographic wavelength is shorter than the second lithographic wavelength. Exposure to the first lithographic wavelength causes a self-aligned mask to form within the photoresist layer.

22 Claims, 4 Drawing Sheets

SELF-ALIGNED PATTERN FORMATION USING WAVELENGHTS

FIELD OF THE INVENTION

The present invention relates generally to self-aligned pattern formation. More particularly, the present invention relates to self-aligned pattern formation using dual wavelengths to achieve smaller resolution than is achievable by conventional ultraviolet (UV) lithography.

BACKGROUND OF THE INVENTION

The semiconductor or IC industry aims to manufacture integrated circuits (ICs) with higher and higher densities of devices on a smaller chip area to achieve greater functionality and to reduce manufacturing costs. This desire for large scale integration has led to a continued shrinking of circuit dimensions and device features. The ability to reduce the size of structures, such as, gate lengths in field-effect transistors and the width of conductive lines, is driven by lithographic performance.

Semiconductor fabrication techniques often utilize a photomask (also referred to as a mask) or a reticle. Radiation is provided through or reflected off the mask or reticle to form an image on a semiconductor wafer. Generally, the image is focused on the wafer to pattern a layer of material, such as, photoresist material. In turn, the photoresist material is utilized to define doping regions, deposition regions, etching regions, or other structures associated with integrated circuits (ICs). The photoresist material can also define conductive lines or conductive pads associated with metal layers of an integrated circuit. Further, the photoresist material can define isolation regions, transistor gates, or other transistor structures and elements.

To transfer an image or pattern onto the photoresist material, a conventional lithographic system generally includes a light source configured to provide electromagnetic radiation or light at one or more wavelengths. The light source may produce radiation at a wavelength of 365 nanometers (nm), 248 nm, and/or 193 nm. The photoresist material patterned by such radiation is selected to be responsive at the wavelength of such radiation. Preferably, the areas of the photoresist material upon which radiation is incident undergo a photochemical change such that it becomes suitably soluble or insoluble in a subsequent developing process step.

Because the resolution of features is, in part, proportional to the exposure wavelength, it is desirable to pattern photoresist material using shorter exposure wavelengths (e.g., 157 nm, 126 nm, or 13.4 nm). Unfortunately, few, if any, materials or processes can consistently fabricate semiconductor integrated devices at such shorter wavelengths. Attempts to use conventional photoresist materials, such as organic based photoresist materials, used in 365 nm, 248 nm, or 193 nm lithographic systems are not without problems. Organic based photoresist materials exhibit high optical absorption per unit thickness in single layer patterning applications at the shorter lithographic or exposure wavelengths. Thus, conventional organic based photoresist materials become increasingly opaque to the exposing radiation and the necessary photochemical change does not occur throughout the entire thickness of the material.

To overcome this drawback, a thinner layer of conventional photoresist material (relative to the thickness used in longer wavelength lithography) has been tried with shorter lithographic wavelengths. Unfortunately, the use of a thinner layer of photoresist material is problematic especially during etch processing. Among others, using a thinner layer results in low pattern fidelity, thin film instability problems, and/or inadequate imaging performance.

Thus, there is a need for a system and method for effectively extending the use of conventional photoresist materials to shorter lithographic wavelengths in the deep ultraviolet (DUV) or extreme ultraviolet (EUV) range. There is a further need for a system and method of pattern formation that achieves the feature resolutions of shorter lithographic wavelengths without extensive modifications to conventional lithographic techniques, materials, or equipment. Even further still, there is a need for a process or method that provides pattern self alignment and obviates the need for mask overlay.

BRIEF SUMMARY OF THE INVENTION

An exemplary embodiment relates to an integrated circuit fabrication process. The process includes exposing a photoresist material provided over a substrate to a first radiation at a first lithographic wavelength, and selectively transforming a top portion of the photoresist material in accordance with a pattern provided on a mask or reticule. The process further includes exposing the photoresist material to a second radiation at a second lithographic wavelength. The first lithographic wavelength is smaller than the second lithographic wavelength. The transformed top portion of the photoresist material is non-transparent to the second radiation.

Another exemplary embodiment relates to an integrated circuit fabrication system. The system comprises a first light source providing a first radiation at a first lithographic wavelength, and a second light source providing a second radiation at a second lithographic wavelength. The system further includes a self-aligned mask included in a photoresist layer. The self-aligned mask is formed by exposure to the first radiation at the first lithographic wavelength in accordance with a patterned mask or reticule.

Still another exemplary embodiment relates to a method of extending the use of currently available DUV-248 nm and DUV-193 nm photoresists to 157 nm, 127 nm, and 13.4 nm lithographic regimes. The method includes providing a first radiation at a short lithographic wavelength. The method further includes transforming a top portion of a photoresist layer provided over a substrate in accordance with a pattern on a mask or reticule. The transformed top portion of the photoresist layer includes at least one polymerized area where the first radiation is incident thereon. The transformed top portion comprises the pattern from the mask or reticule.

BRIEF DESCRIPTION OF THE DRAWINGS

The preferred embodiment will become more fully understood from the following detailed description, taken in conjunction with the accompanying drawings, wherein like reference numerals denote like elements, in which.

DETAILED DESCRIPTION OF THE EXEMPLARY EMBODIMENTS

With reference to FIGS. 1–10, an exemplary embodiment of an advantageous scheme for self aligning a pattern onto a photoresist material will be described. The advantageous scheme also provides sub-lithographic feature resolution on the order smaller than the resolution limit of the first wavelength $\lambda_1$ (the shorter of the dual wavelengths).

Figure 1:
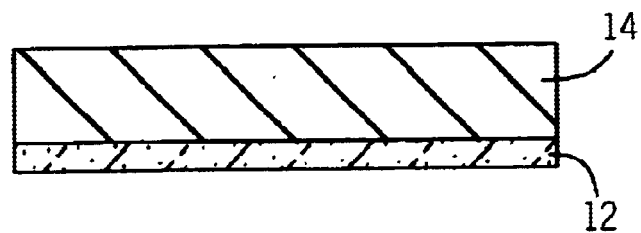
FIG. 1 is a cross-sectional view showing a lipophilic photoresist layer on top of a silicon wafer substrate.
Figure 2:
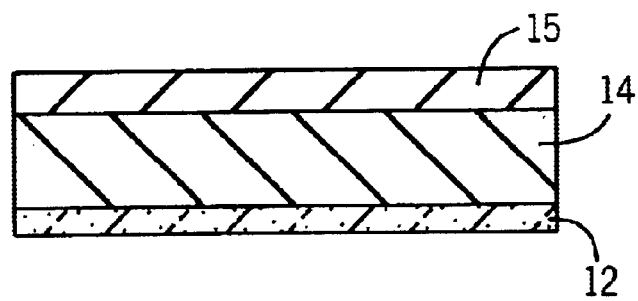
FIG. 2 is a cross-sectional view of a film of organotrialkoxysilane, photobase generator, and catalytic amount of water on top of the lipophilic photoresist layer

With reference to FIG. 1, a first exposure step comprising the advantageous process is performed on a portion of an integrated circuit (IC). The portion includes a photoresist layer 14 provided on a substrate 12. Substrate 12 can be an IC wafer, a semiconductive material, an insulative material, a conductive material, layers above any of the listed materials, or a base layer. Substrate 12 can be an industry standard silicon wafer. Substrate 12 is not described in a limiting fashion.

Substrate 12 can include insulative, conductive, or semiconductive layers above or below its top surface. The insulative, conductive or semiconductive layers can be deposited or grown on substrate 12 or on layers above layers on substrate 12. Although shown directly above substrate 12, layer 14 can be provided above base layers, intermediate layers, anti-reflective coatings, or other layers.

Figure 3:
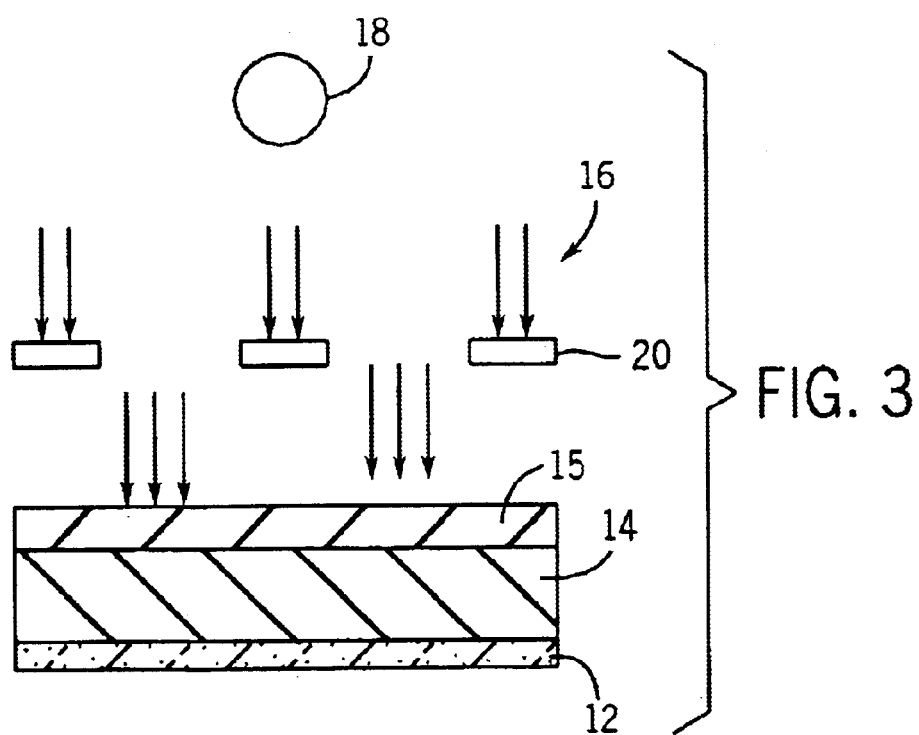
FIG. 3 is a cross-sectional view of the portion of the integrated circuit illustrated in FIG. 2, showing a first exposure step at wavelength $\lambda_1$.

Photoresist layer 14 is selected to have photochemical reactions in response to electromagnetic radiation 16 from a first light source 18 (FIG. 3). Photoresist layer 14 can be any conventional positive photoresist material. Preferably, photoresist layer 14 is comprised of a 193-nm or 248-nm wavelength photosensitive lipophilic polymeric material with the appropriate photoacid generator applied to substrate 12 at a thickness of 100–500 nm by spin coating.

First light source 18 can be any number of sources of electromagnetic radiation. First light source 18 can be a single light source or multiple light sources for providing radiation 16 at a short wavelength. Preferably, first light source 18 provides radiation 16 at a short wavelength (193 nm, 248 nm) in the deep ultraviolet (DUV) or vacuum ultraviolet (157 nm, 126 nm), or extreme ultraviolet (EUV) range, such as, 11.4 nm, 13.4 nm. The short wavelength $\lambda_1$ of radiation 16 (also referred to as the short lithographic wavelength) preferably can polymerize organotrialkoxysilane monomers such as aryltriethoxysilane in the presence of photobase generators (PBG) such as o-nitrobenzoyl carbamates and urethanes, o-acyloxime, benzoin carbamate, oxime-urethanes, etc. and catalytic amount of water, as shown in Equation 1 below:

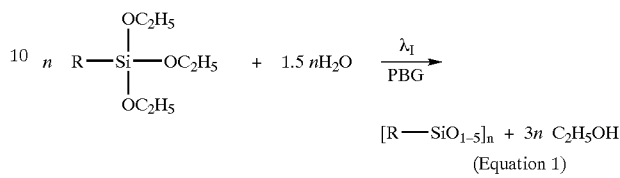

$$n \ R—Si(OC_2H_5)_3 + 1.5\, nH_2O \xrightarrow[PBG]{\lambda_1} [R—SiO_{1\text{-}5}]_n + 3n\ C_2H_5OH$$

(Equation 1)

R = aryl group

First light source 18 can be a laser light source such as an $F_2$ excimer laser (157 nm), XeCl laser, ArF excimer laser (193 nm), KrF laser (248 nm), or laser-produced Xe plasma (13.4 nm, 11.4 nm) or discharge-produced plasma (at 13.4 nm, 11.4 nm) or other radiations such as electron beam, ion beam, gamma ray, etc. Alternatively, light source 18 can be a laser light source that emits two or more wavelengths in various wavelength ranges, such as, an argon laser.

Radiation 16 from first light source 18 is provided via a mask or reticle 20 in accordance with a pattern on mask or reticle 20 to photoresist layer 14. Mask or reticle 20 is preferably a conventional photomask or reticle including a glass substrate (e.g., fused silica) and an opaque material (e.g., chromium). Although not shown, there may also be other components or equipment provided between light source 18 and photoresist layer 14 to transfer the image on mask 20 to photoresist layer 14, such as, an optical system (e.g., one or more lens assemblies).

In one embodiment, a film 15 (FIG. 2) of arylalkoxysilane monomer with a photobase generator, and catalytic amount of water is coated on top of the lipophilic photoresist layer 14 and exposed to the short wavelength light $\lambda_1$. If necessary, a few monolayers of an adhesion promoter like hexamethyldisilazane may be coated on top of the photoresist to improve the adhesion of the arylalkoxysilane monomer to the photoresist. Examples of arylalkoxysilane monomers are: pheny-t-butyl-ether triethoxysilane, 1-phenyl-1-phenyl-t-butylether diethoxysilane, and benzyl-t-butylether triethoxysilane. These monomers can be combined or mixed depending on desired characteristics. Preferably, the monomer has available bonds associated with the Si atoms that can be activated to promote polymerization by short wavelength exposure and subsequent developments. The monomer preferably has a profile of light absorbance as a function of the wavelength in which absorbance is lower at the shorter wavelengths to achieve current resolution goals and absorbance is higher at the longer wavelength to which more conventional resists are sensitive. Although these characteristics are preferred, the characteristics are not necessarily required for a photoresist material to fall within the scope of any claim unless explicitly required by the claim.

Figure 4:
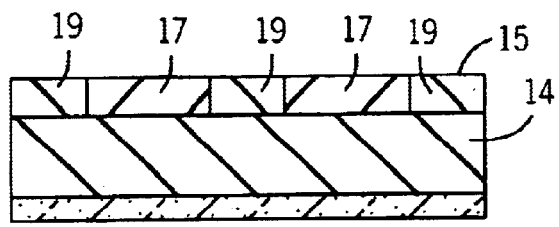
FIG. 4 is a cross-sectional view of the portion of the integrated circuit illustrated in FIG. 3, showing the polymerization of the exposed parts of organoarylalkoxysilane layer by the photogenerated base from the photobase generator and catalytic amount of water at first exposure step at wavelength $\lambda_1$.

Upon exposure through a photomask (mask 20), the photobase generator generates a photobase, which catalyzes the polymerization of the arylalkoxysilane monomer in the presence of water in the exposed part of film 15 (FIGS. 3 and 4). While the arylalkoxysilane monomer (see regions 19) is reasonably transparent at 157 nm, the poly(arylalkoxysilane) is quite opaque (see regions 17). The absorbance of the poly(arylalkoxysilane) (regions 17) is significantly higher at 193 nm than at 157 nm (see FIG. 10).

Figure 5:
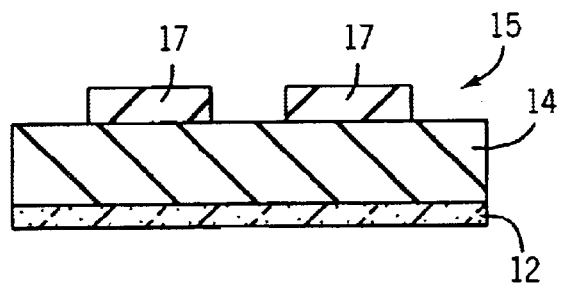
FIG. 5 is a cross-sectional view of the portion of the integrated circuit illustrated in FIG. 4, showing a self-aligned pattern formation step, following the washing away of the unpolymerized organoarylalkoxysilane with water/methanol solution.
Figure 6:
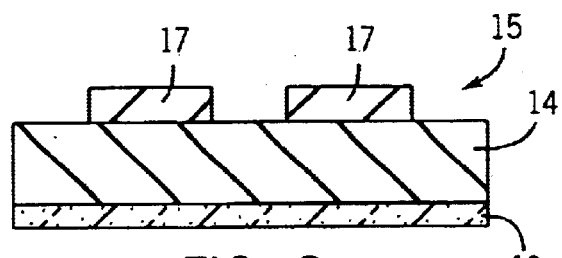
FIG. 6 is a cross-sectional view of the portion of the integrated circuit illustrated in FIG. 5, showing a self-aligned pattern formation step, following the baking of the polymerized organoarylalkoxysilane layer.

Washing the arylalkoxysilane/poly(arylalkoxysilane layer (layer 15 including regions 17 and 19) with water/methanol mixture removes the unpolymerized arylalkoxysilane monomer (region 19) from the unexposed part, leaving the poly (arylalkoxysilane) (region 17) in the exposed part of film 15 (FIG. 5). Baking at an appropriate temperature drives off the residual solvent, leaving a top layer with poly (arylalkoxysilane), which effectively serves as a mask for the subsequent exposure step (FIG. 6).

Figure 7:
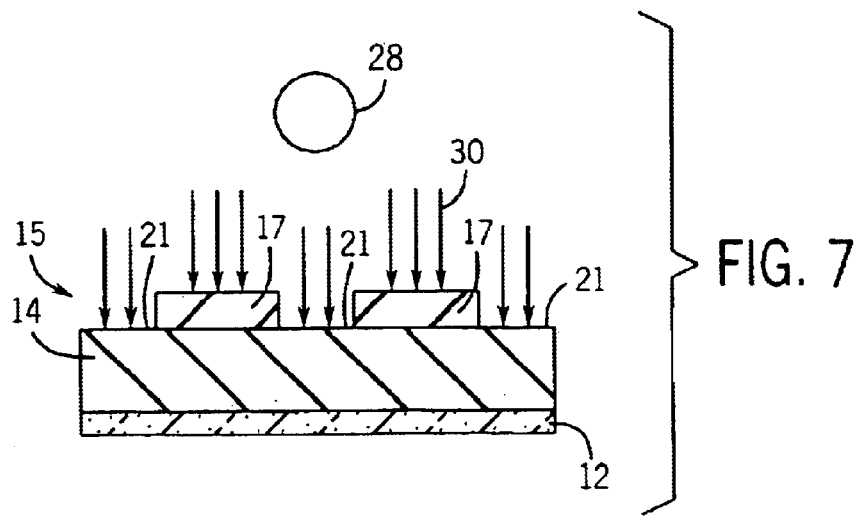
FIG. 7 is a cross-sectional view of the portion of the integrated circuit illustrated in FIG. 6, showing a flood exposure step at wavelength $\lambda_2$.
Figure 8:
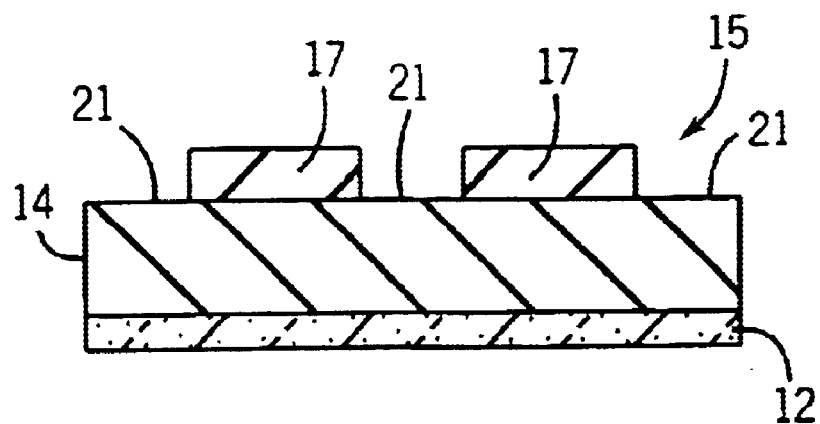
FIG. 8 s a cross-sectional view of the portion of the integrated circuit illustrated in FIG. 7 showing a post-exposure bake step.
Figure 9:
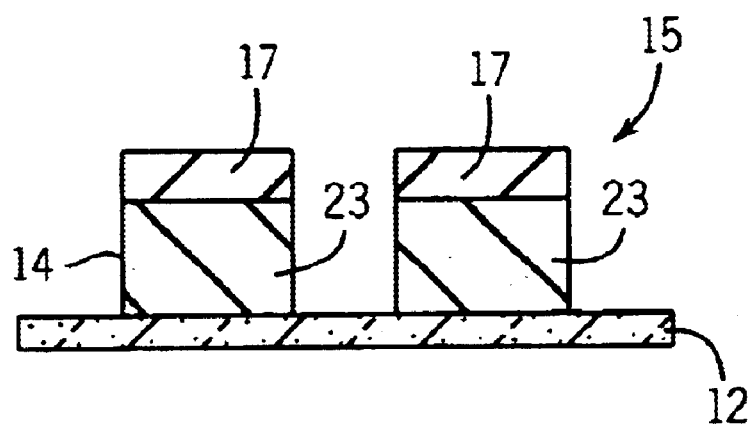
FIG. 9 is a cross-sectional view of the portion of the integrated circuit illustrated in FIG. 8 showing a develop step.

Flood exposing the self-aligned mask/photoresist combination (layer 14 and film 15) at a longer wavelength $\lambda_2$ effectively transforms the unmasked sections (regions 21) of the photoresist layer, in a self-aligned mask fashion (FIG. 7). Applying the conventional post-applied bake (FIG. 8), followed by solvent development in an aqueous base like tetramethylammonium hydroxide (TMAH), washes the exposed part of the photoresist, leaving self-aligned masked patterns of the unexposed sections 23 of the photoresist. (FIG. 9)

Photoresist layer 14 is preferably a positive photoresist that is transparent to radiation at longer ultraviolet (UV) wavelengths (e.g., 365 nm, 248 nm, or 193 nm) and is marginally or semi-transparent to radiation at shorter wavelengths (e.g., 157 nm, 126 nm, or 13.4 nm). For example, photoresist layer 14 can be a photoresist conventionally used in 193 nm lithography, such as Sumitomo Chemical's PAR720™, PAR707™, or a photoresist used in 248 nm lithography such as Shipley's UV110™—an environmentally stable chemically amplified photoresist (ESCAP).

Film 15 and photoresist layer 14 form a bi-layer photoresist with two distinct and separate layers. The top layer (film 15) polymerizes and becomes opaque at longer wavelengths to which the bottom layer (layer 14) is sensitive. The bottom layer can be a more conventional photoresist material and unlike the top layer, the bottom layer cannot be patterned efficiently by the shorter wavelength radiation.

After the first exposure step of FIG. 3, pattern transfer from mask 20 has occurred, as represented by polymerized areas or regions 17 of layer 14. Polymerized areas 17 have feature resolution on the order of approximately one-half the wavelength to the wavelength of the short exposure wavelength of radiation 16. Continuing the example, polymerized region 17 created by exposure to a 157 nm radiation has a feature resolution of approximately 72–157 nm. Alternatively, radiation 16 at a wavelength of 126 or 13.4 nm would result in a possible resolution of approximately 63–126 nm or 6.7–13.4 nm, respectively.

Polymerized areas or regions 17 are preferably opaque or non-transparent to radiation at longer lithographic wavelengths (e.g., 365, 248, or 193 nm) conventionally used to expose photoresist layer 14. Such opaqueness permits polymerized areas or regions 17 to serve as a self-aligned mask or reticle in a longer wavelength exposure step involving portion 10 (FIG. 7).

In a second exposure step (FIG. 7), mask 20 (FIG. 3) is no longer needed to transfer a pattern onto portion 10. Instead, polymerized areas or regions 17 of film 15 advantageously serve as a self-aligned mask of the pattern or image provided by mask 20. A second light source 28 provides flood exposure of radiation 30 at a longer lithographic or exposure wavelength of, for example, 248 nm. The wavelength of radiation 30 and layer 14 are selected such that exposed areas of layer 14 (i.e., areas not covered by polymerized areas or regions 17) are transparent to radiation 30 and undergo a photochemical reaction to become soluble (soluble areas or regions 21 in FIG. 8), while areas underneath polymerized areas or regions 17 will not be exposed to radiation 30 due to the opaqueness of polymerized areas or regions 17 and remain insoluble (insoluble areas or regions 23 in FIG. 8).

First and second light sources 18, 28 can be the same light source that emits radiation at two wavelengths, i.e., the short and long UV lithographic wavelengths. Alternatively, light source 28 can be an excimer laser, an ND:YAG laser, a frequency multiplied ND:YAG laser, a He-Ne scanning laser, or other light source. There may also be provided additional components or equipment between light source 28 and portion 10 to provide desirable radiation 30 to layer 14.

Accordingly, after the second exposure step, the pattern or image provided on mask 20 will be fully transferred to photoresist layer 14 at a resolution determined by the first exposure step. The exposed areas of layer 14 are soluble areas or regions 21 and the non-exposed areas of layer 14 or regions 23 (FIG. 9) (due to polymerized areas or regions 17) become insoluble areas (see FIGS. 8 and 9). In a developing step, soluble areas or regions 17 of layer 14 are removed such that only cross-linked areas or regions 17 and insoluble areas or regions 21 of layer 14 remain on substrate 12 (FIG. 9). Preferably, the developing step utilizes a solvent developer conventionally selected to develop material comprising layer 14. For example, photoresist used for 248 nm lithography can use a 0.24N tetramethylammonium hydroxide developer to remove soluble areas or regions 21.

In the preferred embodiment, polymerized areas or regions 17 become insoluble upon exposure to short lithographic wavelength radiation. Alternatively, it should be understood that polymerized areas or regions 17 may undergo further chemical changes upon exposure to long lithographic wavelength radiation as long as it functions as a mask during the second exposure step. Preferably, polymerized areas or regions 17 remain after the developing step and aid in subsequent processing steps such as an etching step or a deposition step involving portion 10. Regions 17 can improve etch stability of the top layer relative to the photoresist layer during anisotropic etching because it can be converted to silicon dioxide ($SiO_2$) under plasma etching conditions.

In this manner, an advantageous scheme for achieving small feature resolutions using conventional equipment and materials is described herein. Using sequential radiation of differing wavelengths, a short lithographic wavelength followed by a longer lithographic wavelength, a photoresist conventionally used in longer wavelength lithography can be patterned with radiation of a short lithographic wavelength. Even further, the pattern resolution is smaller than those achievable with longer wavelength lithography, pattern resolution on the order of the short lithographic wavelength. Even still further, possible mask overlay or alignment problems are obviated through a self-aligned mask generated during the patterning process.

Figure 10:
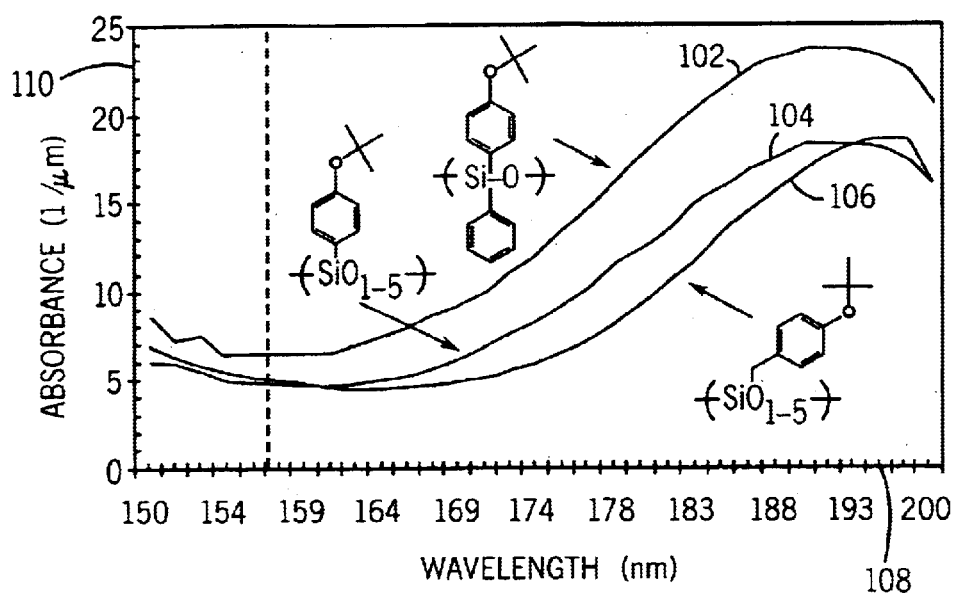
FIG. 10 is plot of absorption spectra of representative organoarylalkoxysilane from 150 nm to 200 nm.

With reference to FIG. 10, the absorber of arylsiloxane materials with respect to wavelength is shown. A line 102 represents the absorbance ($1/\mu m$) on a Y-axis 110 across X-axis 108 (wavelength $\lambda_1$). A line 102 similarly represents absorbance of poly(1-phenyl-1-phenyl-t-butylether siloxane), line 104 represents poly(phenyl-t-butylether siloxane), and a line 106 similarly represents absorbance of poly(benzyl-t-butylether siloxane). The change or difference in absorbance at 193 nm with respect to the absorbance at 157 nm advantageously allows a superior lithographic process to be designed.

It is understood that while the preferred embodiment and specific examples are given, they are for the purpose of illustration only and are not limited to the precise details described herein. For example, although specific wavelengths of light are described, other wavelengths of light can be utilized. Various modifications may be made in the details within the scope and range of the equivalence of the claims without departing from what is claimed.

What is claimed is:

1. An integrated circuit fabrication process, the process comprising:

exposing a photoresist material provided including arylalkoxysilane over a substrate to a first radiation at a first lithographic wavelength;

selectively transforming a top portion of the material in accordance with a pattern provided on a mask or reticle; and exposing the photoresist material to a second radiation at a second lithographic wavelength, wherein the first lithographic wavelength is shorter than the second lithographic wavelength and the transformed top portion of the photoresist material being non-transparent to the second radiation.

2. The process of claim 1, wherein the first lithographic wavelength is selected from a wavelength including 157 nm, 126 nm, and 13.4 nm.

3. The process of claim 1, wherein the second lithographic wavelength is selected from a wavelength including 365 nm, 248 nm, and 193 nm.

4. The process of claim 1, wherein the exposing step with the first radiation is performed before the exposing step with the second radiation.

5. The process of claim 1, further comprising providing the transformed top portion of the photoresist material as a self-aligned mask for the exposing step with the second radiation.

6. The process of claim 1, wherein the photoresist material is a positive photoresist material.

7. The process of claim 1, wherein the transformed top portion of the photoresist material comprises polymerized organoarylalkoxysilane material.

8. The process of claim 7, wherein the thickness of the transformed top portion is at least 10 nm.

9. The process of claim 1, further comprising transferring the pattern of the mask or reticle onto the photoresist material, wherein a resolution of the transferred pattern is determined by the first lithographic wavelength.

10. A method of extending the use of 248 nm and 193 nm photoresists to lithographic regimes less than approximately 157 nm in an integrated circuit, the method comprising:

providing a first radiation at a short lithographic wavelength;

transforming a top portion of a photoresist layer provided over a substrate in accordance with a pattern on a mask or reticle, wherein the transformed top portion on top of the photoresist layer includes at least one polymerized area where the first radiation is incident thereon and comprises the pattern from the mask or reticle; and providing a second radiation at a long lithographic wavelength after providing a first radiation, wherein the short lithographic wavelength is smaller than the long lithographic wavelength.

11. The method of claim 10, wherein the photoresist includes an arylalkoxysilane.

12. The method of claim 11, wherein the mask or reticle is omitted at a second radiation step.

13. The method of claim 11, wherein the second radiation is not transmitted through the polymerized area.

14. The method of claim 13, further comprising patterning the photoresist layer in accordance with each of a plurality of polymerized areas on top of the photoresist layer and the second radiation, wherein the resolution of the patterned photoresist layer is determined by the short lithographic wavelength of the first radiation.

15. An integrated circuit fabrication process, the process comprising:

exposing a photoresist material provided over a substrate to a first radiation;

selectively transforming a top portion of the material in accordance with a pattern provided on a mask or reticle; and exposing the photoresist material to a second radiation, wherein the first radiation has a shorter wavelength than the second radiation.

16. The process of claim 15, wherein the first radiation is selected from a radiation wavelength including 157 nm, 126 nm, and 13.4 nm.

17. The process of claim 15, wherein the second radiation is selected from a radiation wavelength including 365 nm, 248 nm, and 193 nm.

18. The process of claim 15, wherein the exposing step with the first radiation is performed before the exposing step with the second radiation.

19. The process of claim 15, wherein the transformed top portion of the photoresist material is non-transparent to the second wavelength radiation.

20. The process of claim 15, wherein the photoresist material includes an arylalkoxysilane monomer with a photobase generator and a catalytic amount of water.

21. The process of claim 15, wherein the transformed top portion of the photoresist material comprises polymerized organoarylalkoxysilane material.

22. The process of claim 21, wherein the thickness of the transformed top portion is at least 10 nm.

* * * * *